(12) United States Patent
Naitou et al.

(10) Patent No.: US 7,419,773 B2
(45) Date of Patent: Sep. 2, 2008

(54) RINSING METHOD AND DEVELOPING METHOD

(75) Inventors: Ryouichirou Naitou, Kumamoto (JP); Takeshi Shimoaoki, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/652,497

(22) Filed: Jan. 12, 2007

(65) Prior Publication Data

US 2007/0134601 A1    Jun. 14, 2007

(51) Int. Cl.
C03F 7/26    (2006.01)
(52) U.S. Cl. ...................... 430/331; 430/463
(58) Field of Classification Search .............. 430/331, 430/463
See application file for complete search history.

(56) References Cited

U.S. PATENT DOCUMENTS 4,786,578 A * 11/1988 Neisius et al. ............. 430/256
2006/0124586 A1 * 6/2006 Kobayashi et al. ......... 216/41

FOREIGN PATENT DOCUMENTS

| JP | 7-142349 | 6/1995 |
| JP | 2001-005191 | 1/2001 |
| JP | 2003-524213 | 8/2003 |
| JP | 2004-184648 | 7/2004 |

OTHER PUBLICATIONS

U.S. Appl. No. 60/185,343.*
Cover page of PCT Publication No. WO 2006/006317with International Search Report (PCT/ISA/210), issued in connection with PCT/JP2005/010068.
Notification Concerning Submission or Transmittal of Priority Document (PCT/IB304) issued in connection with PCT/JP2005/010068 (Jan. 2004).
First Notice Informing the Applicant of the Communication of the International Application to the designated Offices (PCT/IB/308) issued in connection with PCT/JP2005/010068 (Jan. 2004).

* cited by examiner

*Primary Examiner*—Hoa V Le
(74) *Attorney, Agent, or Firm*—Smith, Gambrell & Russell, LLP

(57) ABSTRACT

A rinsing process is performed by supplying a rinsing liquid onto a substrate with a light-exposed pattern formed thereon and treated by a developing process. The rinsing liquid contains a polyethylene glycol family surfactant or an acetylene glycol family surfactant in a critical micelle concentration or less. Preferably, the surfactant includes a hydrophobic group having a carbon number of larger than 11 and having no double bond or triple bond therein.

20 Claims, 8 Drawing Sheets

RINSING METHOD AND DEVELOPING METHOD

BACKGROUND OF THE INVENTION

1. Field of the Invention

The present invention relates to a rinsing method for performing a rinsing process on a substrate, such as a semiconductor wafer, after a developing process is performed on a light-exposed pattern formed thereon, and a developing method including such a rinsing process.

2. Description of the Related Art

For example, in the process of manufacturing semiconductor devices, a so-called photolithography technique is used. According to this photolithography technique, a resist liquid is applied onto the surface of a semiconductor wafer (which will be referred to as "wafer") to form a resist film. Then, the resist film is subjected to a light exposure process in accordance with a predetermined pattern. Then, the resist film with the light-exposed pattern thus formed is subjected to a developing process.

In the developing process used as one of the steps of the photolithography technique, a developing solution is supplied onto the wafer to form a developing solution puddle. Then, this state is held for a predetermined time to promote the developing process by natural convection. Thereafter, the developing solution is thrown off, and purified water is then supplied as a cleaning liquid to wash out the developing solution remaining on the wafer. Then, the wafer is rotated at a high speed to throw off the developing solution and cleaning liquid remaining on the wafer, thereby drying the wafer.

In recent years, circuit structures of semiconductor devices are increasingly miniaturized with advances in light exposure techniques and so forth, and thus resist patterns with a smaller size and a higher aspect ratio have come into use. Accordingly, a problem arises such that resist patterns are pulled and bent by a surface tension of a rinsing liquid, i.e., so-called "pattern fall" is caused, when the rinsing liquid is being removed from the gaps between the patterns during a throwing-off/drying operation at the end of the developing step described above.

As a technique to solve this problem, Jpn. Pat. Appln. KOKAI Publication No. 7-142349 discloses a proposed technique such that, for example, a surfactant solution is mixed into a rinsing liquid to decrease the surface tension of the rinsing liquid. Further, Jpn. Pat. Appln. KOKAI Publication No. 2001-5191 discloses a process in which a surfactant is supplied when a rinsing process is performed on a substrate after a developing process.

Unlike the conventional process using purified water, however, where a surfactant is used together with a rinsing liquid, a problem arises such that the surfactant generates particles and contaminates the wafer. In other words, the wafer suffers precipitation defects due to the surfactant, which deteriorate the quality. Further, another problem arises such that the surfactant dissolves resist patterns, and/or the surfactant causes CD (Critical Dimension) fluctuations. However, so far, optimum process conditions in light of these problems have not yet been found to rinsing processes using a surfactant.

BRIEF SUMMARY OF THE INVENTION

An object of the present invention is to provide a rinsing method and developing method that can suppress generation of precipitation defects in a developing process. An alternative object of the present invention is to provide a rinsing method and developing method that can suppress the CD fluctuation. A further alternative object of the present invention is to provide a rinsing method and developing method that can suppress dissolution of resist patterns due to a rinsing liquid.

The following aspects are conceived to solve the problem described above. According to a first aspect of the present invention, there is provided a rinsing method for performing a rinsing process, the method comprising: supplying a rinsing liquid onto a substrate with a light-exposed pattern formed thereon and treated by a developing process, wherein the rinsing liquid contains a polyethylene glycol family surfactant or an acetylene glycol family surfactant in a critical micelle concentration or less, and the surfactant includes a hydrophobic group having a carbon number of larger than 11 and having no double bond or triple bond therein.

According to a second aspect of the present invention, there is provided a rinsing method for performing a rinsing process, the method comprising: supplying a rinsing liquid onto a substrate with a light-exposed pattern formed thereon and treated by a developing process, wherein the rinsing liquid contains a polyethylene glycol family surfactant or an acetylene glycol family surfactant, and the surfactant includes a hydrophobic group having a carbon number of larger than 11 and having no double bond or triple bond therein.

In the rinsing method according to the first or second aspect, the polyethylene glycol family surfactant is preferably any one of polyethylene glycol sorbitan fatty acid ester, polyethylene glycol straight-chain alkyl ester, polyethylene glycol fatty acid ester, straight-chain alkyl addition type polyethylene glycol phenyl ester, and branched-chain alkyl addition type polyethylene glycol phenyl ester, and the acetylene glycol family surfactant is preferably EO addition type acetylene glycol.

Supplying the rinsing liquid onto the substrate preferably uses a nozzle configured to deliver the rinsing liquid essentially as a belt, and preferably comprises moving the nozzle for scanning above the substrate, while delivering the rinsing liquid essentially as a belt from the nozzle, or setting the nozzle above the substrate to be directed in a radial direction of the substrate and rotating the substrate at a predetermined rotation number, while delivering the rinsing liquid essentially as a belt from the nozzle.

The present invention further provides a developing method using such a rinsing method. According to a third aspect of the present invention, there is provided a developing method for developing a light-exposed pattern, after a resist film formed on a substrate is subjected to light exposure with a predetermined pattern, the method comprising:

applying a developing solution onto the resist film disposed on the substrate after the light exposure, and performing development;

throwing off the developing solution from the substrate after the development;

supplying a rinsing liquid onto the substrate, the rinsing liquid containing a polyethylene glycol family surfactant or an acetylene glycol family surfactant in a critical micelle concentration or less, and the surfactant including a hydrophobic group having a carbon number of larger than 11 and having no double bond or triple bond therein;

supplying purified water onto the substrate to replace the rinsing liquid present on the substrate with purified water; and rotating the substrate to expand purified water on the substrate, and to throw off purified water to dry the substrate.

According to a fourth aspect of the present invention, there is provided a developing method for developing a light-exposed pattern, after a resist film formed on a substrate is subjected to light exposure with a predetermined pattern, the method comprising:

applying a developing solution onto the resist film disposed on the substrate after the light exposure, and performing development;

throwing off the developing solution from the substrate after the development;

supplying purified water onto the substrate, supplying a rinsing liquid onto the substrate to replace purified water present on the substrate with the rinsing liquid, the rinsing liquid containing a polyethylene glycol family surfactant or an acetylene glycol family surfactant in a critical micelle concentration or less, and the surfactant including a hydrophobic group having a carbon number of larger than 11 and having no double bond or triple bond therein; and rotating the substrate to expand the rinsing liquid on the substrate, and to throw off the rinsing liquid to dry the substrate.

According to a fifth aspect of the present invention, there is provided a developing method for developing a light-exposed pattern, after a resist film formed on a substrate is subjected to light exposure with a predetermined pattern, the method comprising:

applying a developing solution onto the resist film disposed on the substrate after the light exposure, and performing development;

throwing off the developing solution from the substrate after the development;

supplying purified water onto the substrate, supplying a rinsing liquid onto the substrate to replace purified water present on the substrate with the rinsing liquid, the rinsing liquid containing a polyethylene glycol family surfactant or an acetylene glycol family surfactant in a critical micelle concentration or less, and the surfactant including a hydrophobic group having a carbon number of larger than 11 and having no double bond or triple bond therein;

supplying purified water onto the substrate to replace the rinsing liquid present on the substrate with purified water; and rotating the substrate to expand purified water on the substrate, and to throw off purified water to dry the substrate.

According to a sixth aspect of the present invention, there is provided a developing method for developing a light-exposed pattern, after a resist film formed on a substrate is subjected to light exposure with a predetermined pattern, the method comprising:

applying a developing solution onto the resist film disposed on the substrate after the light exposure, and performing development;

throwing off the developing solution from the substrate after the development;

supplying a rinsing liquid onto the substrate, the rinsing liquid containing a polyethylene glycol family surfactant or an acetylene glycol family surfactant in a critical micelle concentration or less, and the surfactant including a hydrophobic group having a carbon number of larger than 11 and having no double bond or triple bond therein;

throwing off the rinsing liquid from the substrate;

applying a developing solution onto the substrate again, and performing development;

throwing off the developing solution from the substrate after the development;

supplying purified water onto the substrate; and rotating the substrate to expand purified water on the substrate, and to throw off purified water to dry the substrate.

According to a seventh aspect of the present invention, there is provided a developing method for developing a light-exposed pattern, after a resist film formed on a substrate is subjected to light exposure with a predetermined pattern, the method comprising:

supplying a rinsing liquid onto the substrate, the rinsing liquid containing a polyethylene glycol family surfactant or an acetylene glycol family surfactant in a critical micelle concentration or less, and the surfactant including a hydrophobic group having a carbon number of larger than 11 and having no double bond or triple bond therein;

throwing off the rinsing liquid from the substrate to dry the substrate;

applying a developing solution onto the substrate, and performing development of the resist film;

throwing off the developing solution from the substrate after the development;

supplying purified water onto the substrate; and rotating the substrate to expand purified water on the substrate, and to throw off purified water to dry the substrate.

Also in each of these developing methods, the surfactant contained in the rinsing liquid preferably has a molecular weight of 1,280 or more. Further, the polyethylene glycol family surfactant or acetylene glycol family surfactant consists preferably of a material as one of those described above. The rinsing liquid is preferably supplied by the method described above.

According to the present invention, since a rinsing process is performed while using a surfactant-containing rinsing liquid, it is possible to suppress generation of precipitation defects, such as particles. Further, it is possible to suppress the CD fluctuation and dissolution of resist patterns. It follows that resist patterns can be formed with high precision. As a matter of course, the present invention can solve a problem concerning pattern fall.

DETAILED DESCRIPTION OF THE INVENTION

Embodiments of the present invention will now be described with reference to the accompanying drawings.

Figure 1:
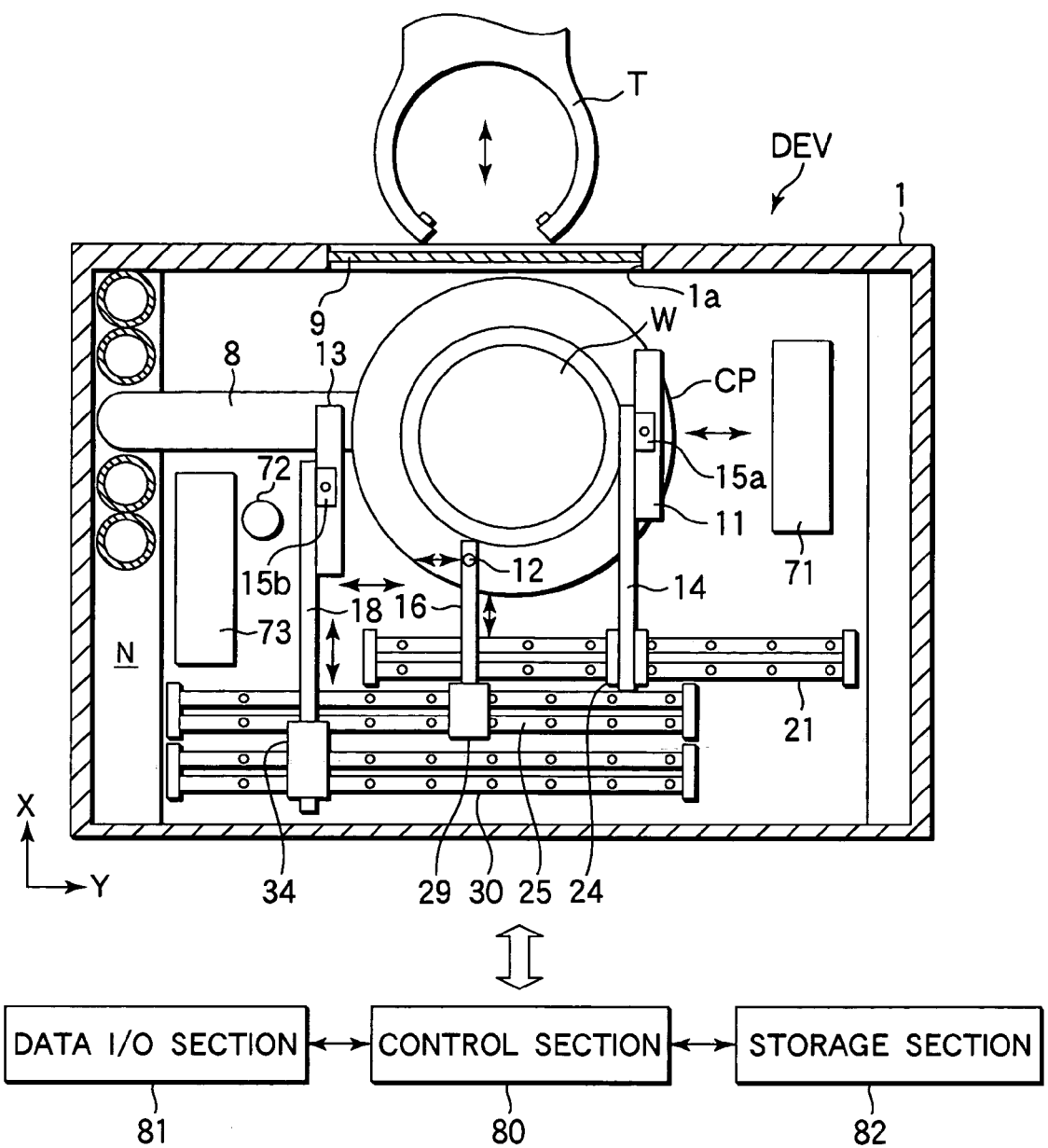
FIG. 1 is a plan view schematically showing the structure of a developing apparatus.
Figure 2:
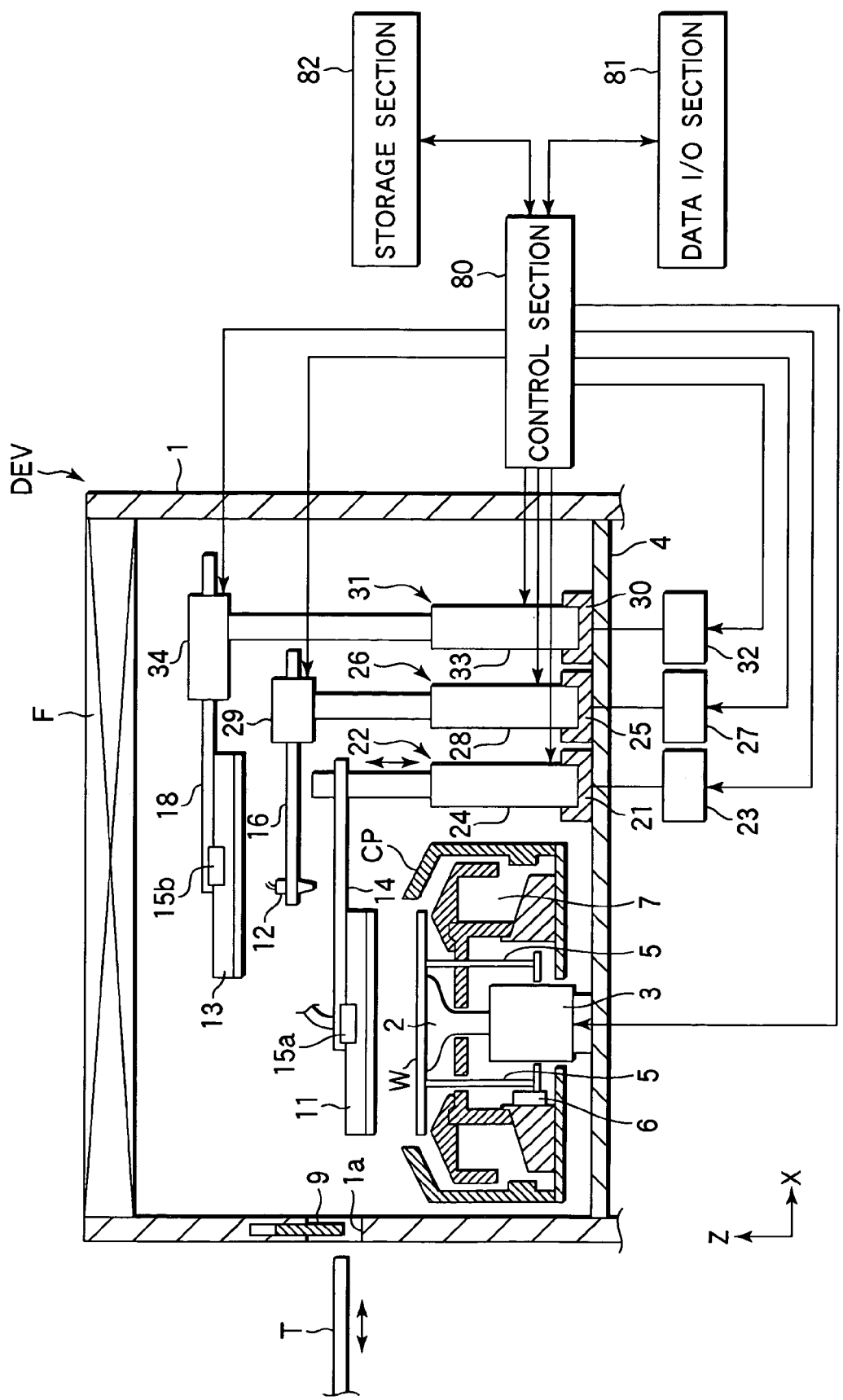
FIG. 2 is a sectional view schematically showing the structure of the developing apparatus.

FIG. 1 is a plan view schematically showing the structure of a developing apparatus, and FIG. 2 is a sectional view thereof. In the following description, two directions perpendicular to each other in the horizontal plane are denoted as an X-direction and a Y-direction, and the vertical direction is denoted as a Z-direction, as shown in FIGS. 1 and 2.

This developing apparatus (DEV) includes a casing 1 provided with a fan and filter unit F at the ceiling thereof to form a downflow of clean air in the casing. An annular cup CP is disposed at the center in the casing 1, and a spin chuck 2 is disposed inside the cup CP. The spin chuck 2 is arranged to fix and hold a wafer W by means of vacuum suction. The spin chuck 2 is operated to rotate by a drive motor 3 disposed below the spin chuck 2. The drive motor 3 is attached to a bottom plate 4.

Lifter pins 5 used for transferring the wafer W are disposed inside the cup CP and are movable up and down by a driving mechanism 6, such as an air cylinder. Further, a drain port 7 used for waste liquid is formed inside the cup CP. The drain port 7 is connected to a waste liquid tube 8, which extends through a space N between the bottom plate 4 and casing 1, as shown in FIG. 1, and is connected to a waste liquid port (not shown) located below.

A sidewall of the casing 1 has an opening 1a formed therein that allows a transfer arm T of a wafer transfer unit to pass therethrough. The opening 1a is opened and closed by a shutter 9. When the wafer W is loaded/unloaded, the shutter 9 is opened, and the transfer arm T comes into the casing 1. The wafer W is transferred between the transfer arm T and the spin chuck 2, while the lifter pins 5 are present at the upper position.

A developing solution nozzle 11, a purified water nozzle 12, and a rinsing liquid nozzle 13 are disposed above the cup CP, such that each of them is movable between a supply position above the wafer W and a waiting position outside the wafer W. The developing solution nozzle 11 is used for supplying a developing solution onto the surface of the wafer W. The purified water nozzle 12 is used for supplying a water-based cleaning liquid onto the wafer W after the development. The rinsing liquid nozzle 13 is used for supplying a rinsing liquid comprising purified water with a surfactant dissolved therein. In the following explanation, the water-based cleaning liquid is purified water (DIW), as an example.

The developing solution nozzle 11 has an elongated shape and is disposed such that the longitudinal direction of the elongated shape is horizontal. The developing solution nozzle 11 has a plurality of delivery ports on the bottom face to deliver the developing solution as a belt as a whole. The developing solution nozzle 11 is detachably attached to the distal end of a first nozzle scan arm 14 by a holding member 15a. The first nozzle scan arm 14 is attached to the upper end of a first vertical support member 22, which stands up in a vertical direction from a first guide rail 21 extending in the Y direction on the bottom plate 4. The developing solution nozzle 11 is horizontally movable together with the first vertical support member 22 in the Y-direction by a Y-axis driving mechanism 23. Further, the first vertical support member 22 is movable up and down by a Z-axis driving mechanism 24, so that the developing solution nozzle 11 can be moved between a delivery position closer to the wafer W and a non-delivery position on the upper side by an up-and-down movement of the first vertical support member 22.

When the developing solution is applied onto the wafer W, the developing solution nozzle 11 is placed at a position above the wafer W. Then, while the developing solution is delivered as a belt from the developing solution nozzle 11, the wafer W is rotated by 180° or more, such as 360°. Consequently, the developing solution is applied all over the surface of the wafer W to form a developing solution puddle. Alternatively, when the developing solution is delivered, the developing solution nozzle 11 may be moved along the first guide rail 21 for scanning without rotating the wafer W.

The purified water nozzle 12 is formed of a nozzle of the straight type. The purified water nozzle 12 is detachably attached to the distal end of a second nozzle scan arm 16. A second guide rail 25 is disposed on the bottom plate 4 at a position outside the first guide rail 21. The second nozzle scan arm 16 is attached through an X-axis driving mechanism 29 to the upper end of a second vertical support member 26, which stands up in a vertical direction from the second guide rail 25. Consequently, the purified water nozzle 12 is horizontally movable together with the second vertical support member 26 in the Y-direction by a Y-axis driving mechanism 27. Further, the second vertical support member 26 is movable up and down by a Z-axis driving mechanism 28, so that the purified water nozzle 12 can be moved between a delivery position closer to the wafer W and a non-delivery position on the upper side by an up-and-down movement of the second vertical support member 26. Furthermore, the second nozzle scan arm 16 is movable in the X-direction by the X-axis driving mechanism 29, so that the purified water nozzle 12 is also movable in the X-direction. The shape of the purified water nozzle 12 is not limited to a specific one. The nozzle 12 may have an elongated shape with a number of delivery ports formed therein, as in the developing solution nozzle 11. Alternatively, the nozzle 12 may be formed of a slit nozzle with a slit-like delivery port.

The rinsing liquid nozzle 13 has an elongated shape and is disposed such that the longitudinal direction of the elongated shape is horizontal, as in the developing solution nozzle 11. The rinsing liquid nozzle 13 has a plurality of delivery ports on the bottom face to deliver the rinsing liquid as a belt as a whole. The rinsing liquid nozzle 13 is detachably attached to the distal end of a third nozzle scan arm 18 by a holding member 15b. A third guide rail 30 is disposed on the bottom plate 4 at a position outside the second guide rail 25. The third nozzle scan arm 18 is attached through an X-axis driving mechanism 34 to the upper end of a third vertical support member 31, which stands up in a vertical direction from the third guide rail 30. Consequently, the rinsing liquid nozzle 13 is horizontally movable together with the third vertical support member 31 in the Y-direction by a Y-axis driving mechanism 32. The purified water nozzle 12 and the rinsing liquid nozzle 13 can pass by each other in the Y-direction. Further, the third vertical support member 31 is movable up and down by a Z-axis driving mechanism 33, so that the rinsing liquid nozzle 13 can be moved between a delivery position closer to the wafer W and a non-delivery position on the upper side by an up-and-down movement of the third vertical support member 31. Furthermore, the third nozzle scan arm 18 is movable in the X-direction by the X-axis driving mechanism 34, so that the rinsing liquid nozzle 13 is also movable in the X-direction.

In a first method for supplying the rinsing liquid onto the wafer W, the rinsing liquid nozzle 13 is placed above the wafer W, and the rinsing liquid is delivered as a belt from the rinsing liquid nozzle 13 while the wafer W is rotated. In another method for supplying the rinsing liquid onto the wafer W, the rinsing liquid nozzle 13 is moved for scanning in the Y-direction above the wafer W, while the rinsing liquid is delivered as a belt from the rinsing liquid nozzle 13. In this second method, the wafer W may be held stationary or rotated. Further, the scanning by the rinsing liquid nozzle 13 in the Y-direction may be performed between the opposite ends of the wafer W in the Y-direction, or between the center of the wafer W and one end thereof in the Y-direction. The rinsing liquid may be continuously supplied such that the rinsing liquid overflows from the wafer W. Alternatively, the rinsing liquid may be supplied such that a rinsing liquid puddle is formed on the wafer W and is held in this state for a predetermined time.

As shown in FIG. 1, on the right side of the cup CP, a developing solution nozzle waiting portion 71 is disposed for the developing solution nozzle 11 to wait. The developing solution nozzle waiting portion 71 is provided with a cleaning mechanism (not shown) for cleaning the developing solution nozzle 11. On the left side of the cup CP, a purified water nozzle waiting portion 72 and a rinsing liquid nozzle waiting portion 73 are disposed for the purified water nozzle 12 and rinsing liquid nozzle 13 to wait, respectively. The purified water nozzle waiting portion 72 and rinsing liquid nozzle waiting portion 73 are provided with cleaning mechanisms (not shown) for cleaning the purified water nozzle 12 and rinsing liquid nozzle 13, respectively.

Figure 3:
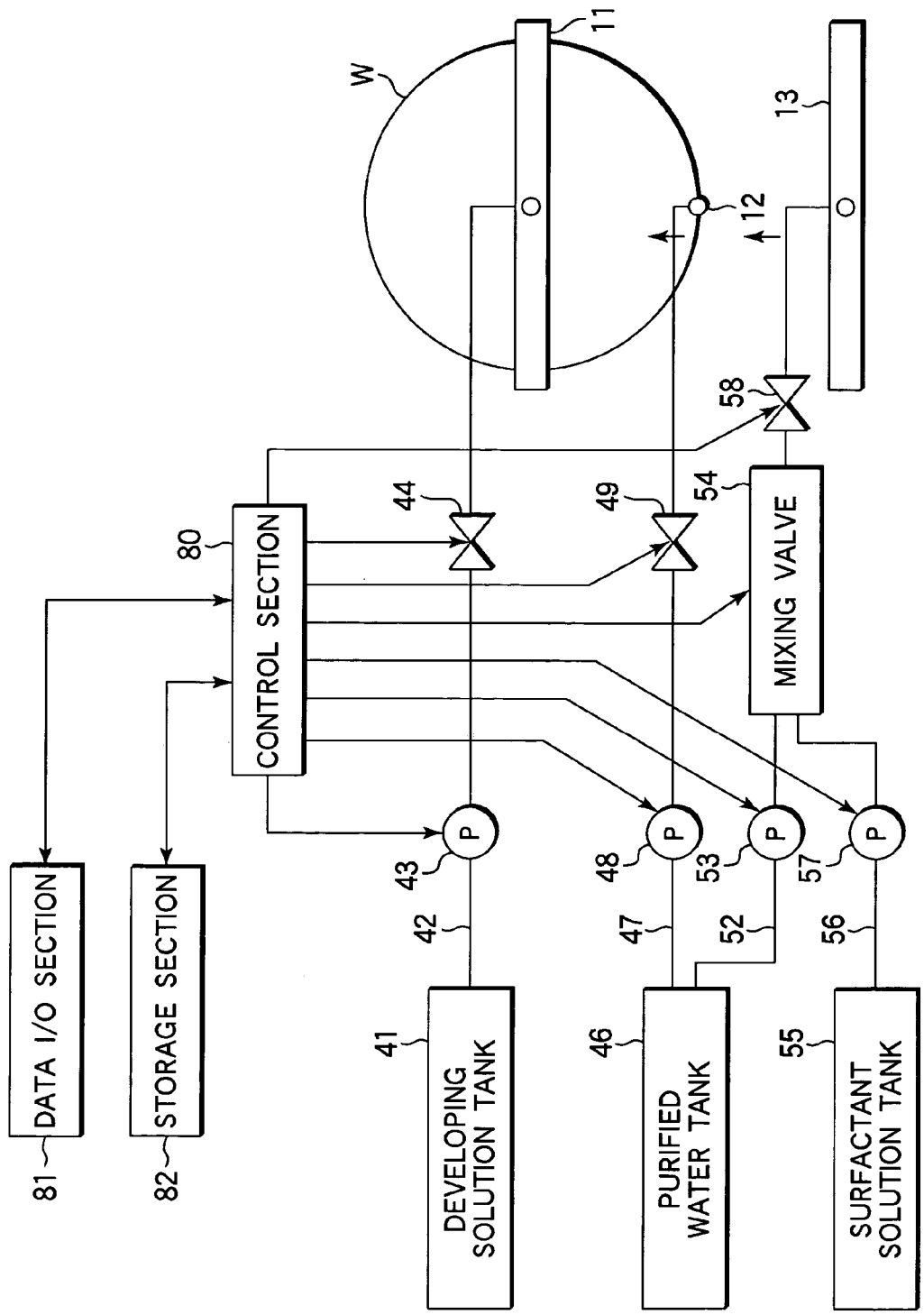
FIG. 3 is a view schematically showing the structure of a liquid supply system used in the developing apparatus.

FIG. 3 is a view schematically showing the structure of a liquid supply system used in the developing apparatus (DEV). The developing solution nozzle 11 is connected to a developing solution supply line 42 for supplying the developing solution from a developing solution tank 41 that stores the developing solution. The developing solution supply line 42 is provided with a pump 43 for supplying the developing solution and an ON/OFF valve 44.

The purified water nozzle 12 is connected to a purified water supply line 47 for supplying purified water from a purified water tank 46 that stores purified water. The purified water supply line 47 is provided with a pump 48 for supplying purified water and an ON/OFF valve 49.

The rinsing liquid nozzle 13 is connected to a purified water supply line 52 for supplying purified water from the purified water tank 46. The purified water supply line 52 is provided with a mixing valve 54 on the way. The mixing valve 54 is connected to a surfactant solution supply line 56 extending from a surfactant solution tank 55 that stores a surfactant solution. The surfactant solution is mixed with purified water within the mixing valve 54. Consequently, the rinsing liquid nozzle 13 can deliver the surfactant-containing rinsing liquid prepared by mixing the surfactant solution with purified water. The purified water supply line 52 and surfactant solution supply line 56 are respectively provided with pumps 53 and 57 upstream from the mixing valve 54. Further, the purified water supply line 52 is provided with an ON/OFF valve 58 downstream from the mixing valve 54.

As described above, the surfactant solution is diluted by means of inline processing because the necessary amount of surfactant varies depending on process conditions and/or patterns. Accordingly, this arrangement makes it possible to use a high-concentration surfactant solution, while suitably diluting it with purified water, so as to match it with any requirement.

Various operation devices used in the developing apparatus (DEV), such as the Y-axis driving mechanisms 23, 27, and 32, the Z-axis driving mechanisms 24, 28, and 33, the X-axis driving mechanisms 29 and 34, the drive motor 3, the pumps 43, 48, 53, and 57, the ON/OFF valves 44, 49, and 58, and the mixing valve 54, are controlled by a control section 80 for controlling sequential processes performed on the wafer W in the developing apparatus (DEV).

The control section (i.e., a computer) 80 for controlling processes performed on the wafer W is connected to a data I/O section 81 including, e.g., a keyboard and a display. The keyboard is used for a process operator to input commands for determining process conditions and so forth for the wafer W. The display is used for showing calculation results obtained by the control section 80 and visualized images of the operational status of cleaning processes and so forth. Further, the control section 80 is connected to a storage section 82 that stores programs and recipes for controlling the developing apparatus (DEV), data concerning processes already performed, and so forth.

More specifically, as described later, the storage section 82 stores programs for the control section 80 to execute various kinds of control over, e.g., the rotation number of the wafer W, operation of the various nozzles, and supply/stop of the developing solution, in the developing apparatus (DEV), so as to perform a series of processes, such as developing process, rinsing process, and drying process, on the wafer W. Further, the storage section 82 stores recipes concerning the time allocation of a series of processes performed on the wafer W, and the flow rate and time for supply of the developing solution and so forth in the processes. The process programs and recipes are stored in a fixed storage medium, such as a hard disk (HD) or memory (RAM or the like), or a portable storage medium selected from various types, such as a CD-ROM (or CD-R or the like), DVD-ROM (or DVD-R or the like), or MO disk, and are readable by the control section 80.

Furthermore, the storage section 82 stores performance data concerning process performed in the developing apparatus (DEV), such as the lot number of wafers W, process recipes used, the date and time of processes, and the presence/absence of malfunction of various driving mechanisms in processes. The performance data can be copied or transferred into a portable storage medium selected from various types, such as a CD-R or MO disk.

Next, a detailed explanation will be given of the rinsing liquid delivered from the rinsing liquid nozzle 13 (specifically, the rinsing liquid is a surfactant solution itself where a surfactant solution stored in the surfactant solution tank 55 is used as the rinsing liquid as it is; or the rinsing liquid is a diluted solution prepared by mixing where a surfactant solution is mixed with purified water at a predetermined ratio).

Figure 4:
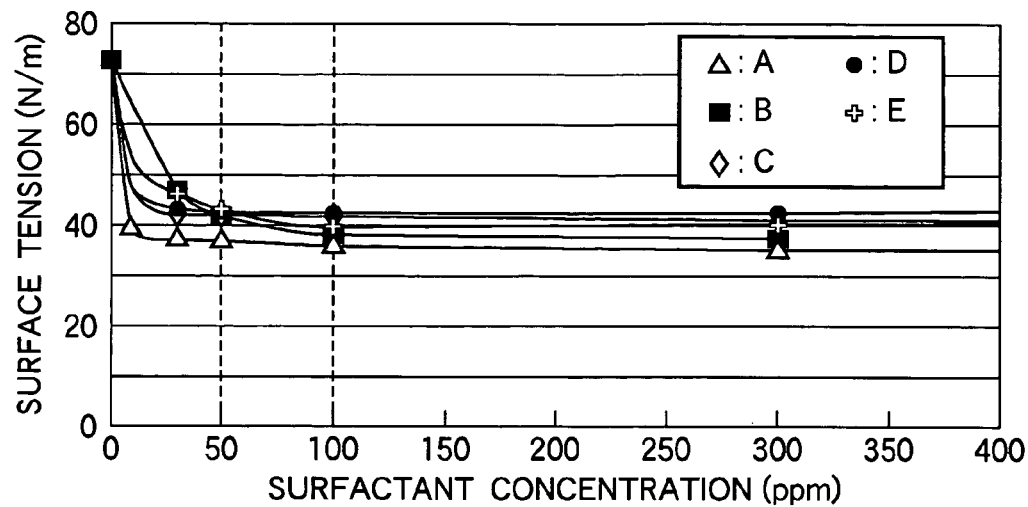
FIG. 4 is a graph showing the relationship between surfactant concentrations and surface tension where surfactants containing hydrophobic groups with different structures were respectively dissolved into purified water.
Figure 5:
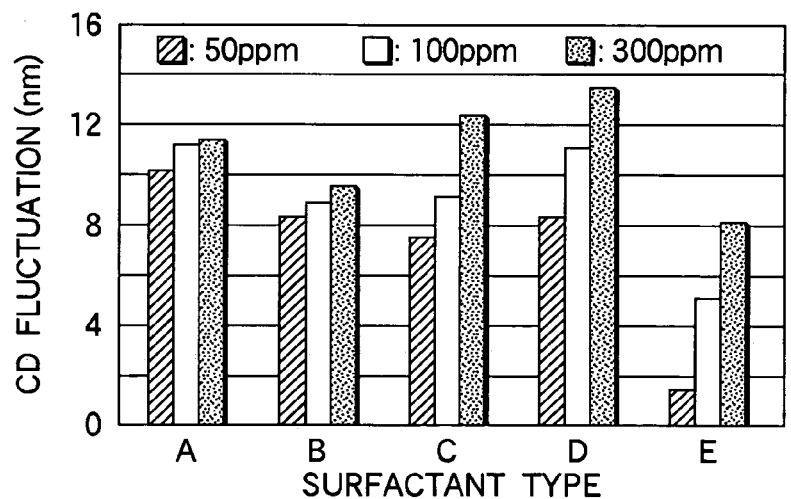
FIG. 5 is a graph showing CD fluctuations where aqueous solutions respectively containing surfactants A to E were used for performing a rinsing process after a developing process.
Figure 6:
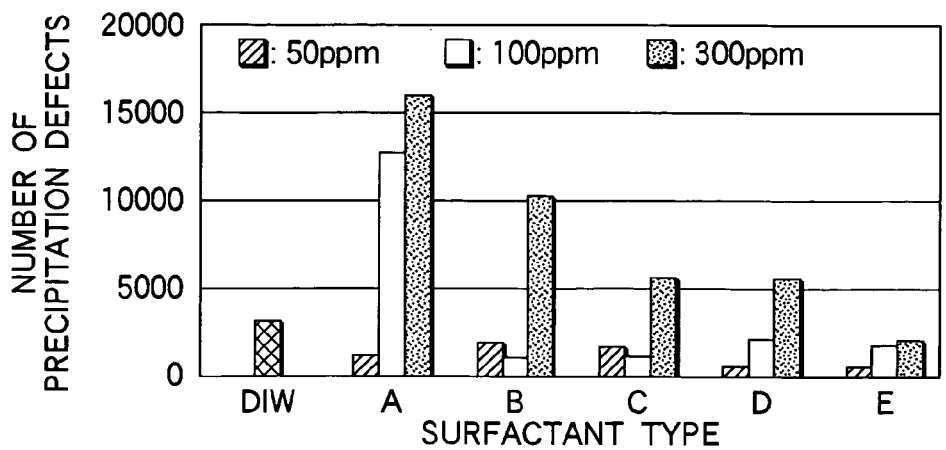
FIG. 6 is a graph showing the number of precipitation defects, such as particles, where aqueous solutions respectively containing surfactants were used for performing a rinsing process after a developing process.

Polyethylene glycol sorbitan fatty acid esters (one type of polyethylene glycol family surfactants) respectively having different hydrophobic groups were used as different five surfactants A to E. FIG. 4 is a graph showing the relationship between surfactant concentrations and surface tension where the surfactants A to E were respectively dissolved into purified water. FIG. 5 is a graph showing CD fluctuations where aqueous solutions respectively containing the surfactants A to E in predetermined concentrations were used for performing a rinsing process after a developing process. FIG. 6 is a graph showing the number of precipitation defects, such as particles, where aqueous solutions respectively containing the surfactants A to E in predetermined concentrations were used for performing a rinsing process after a developing process. Further, Table 1 shows data of the surfactants A to E in terms of the structures of the hydrophobic groups, the molecular weights, the HLB (hydrophile-lipophile balance) value, and the presence/absence of double bonds.

TABLE 1

| Surfactants | Hydrophobic group | Molecular weight | Double bond | HLB |
|---|---|---|---|---|
| A | n-$C_{11}H_{23}$ | 1228 | absence | 16.7 |
| B | n-$C_{15}H_{31}$ | 1284 | absence | 15.6 |
| C | n-$C_{17}H_{35}$ | 1312 | absence | 14.9 |
| D | n-$C_{17}H_{33}$ | 1310 | presence | 15 |
| E | n-$C_{39}H_{73}$ | 1839 | presence | 11 |

The general formula of the polyethylene glycol sorbitan fatty acid ester is expressed by the following composition formula 1. In the composition formula 1, R1 denotes a hydrophobic group.

[Composition formula 1]

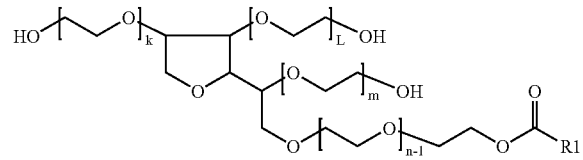

As shown in Table 1, the surfactants A to E had HLB values of 10 or more. This is so because, if the HLB value is less than 10, emulsification (i.e., micelle generation) is easily caused due to the surfactant, and micelles may remain on the wafer W and generate particles.

As shown in FIG. 4, with an increase in the concentration of the surfactants A to E, the surface tension of the aqueous solution first decreases and then becomes constant. Further, where the concentration exceeds a certain concentration, surfactant molecules are agglomerated and generate micelles when the surfactant is dissolved into purified water. When generation of micelles starts, the surface tension of the aqueous solution becomes constant. Accordingly, in other words, the critical micelle concentration (which will be referred to as "CMC") can be found from a change in the surface tension of the aqueous solution. As shown in FIG. 4, the surfactants A to E have CMC values within a range of about 50 to 100 ppm.

As shown in FIG. 5, the CD fluctuation is lowest in the aqueous solutions having a low surfactant concentration of 50 ppm (lower than CMC), and are highest in the aqueous solutions having a high surfactant concentration of 300 ppm (higher than CMC). Further, as shown in FIG. 6, for all of the surfactants A to E, where the aqueous solutions have a surfactant concentration of 50 ppm, the number of precipitation defects is far smaller than that of purified water used as the rinsing liquid. However, at 100 ppm or more for the surfactant A and at 300 ppm for the surfactants B to D, the number of precipitation defects measured is higher than that of purified water used as the rinsing liquid. It is thought that this resulted from micelles generated in the aqueous solution. Further, the number of precipitation defects differs among the surfactants A to E even at the same concentration of 300 ppm. It is thought that this related to a fact that the surfactants differed in aptness in generating micelles at this concentration.

From the results shown in FIGS. 5 and 6, it has been found that the surfactant concentration in the rinsing liquid should be set to be CMC or less, in order to suppress the CD fluctuation and to suppress generation of precipitation defects. On the other hand, where the surfactant concentration in the rinsing liquid is too low, the decrease in the surface tension of the aqueous solution becomes insufficient. In this case, pattern fall may be caused when the rinsing liquid supplied on the wafer W is thrown off from the wafer W. Further, the effect of suppressing the CD fluctuation and generation of precipitation defects becomes insufficient. Accordingly, also in light of the effect of preventing pattern fall, the surfactant concentration in the rinsing liquid is preferably set at a value near CMC and that does not bring about generation of micelles in the aqueous solution. Of the surfactants A to E, the surfactant E is most preferable, and the concentration thereof is preferably set to be 50 ppm.

Figure 7:
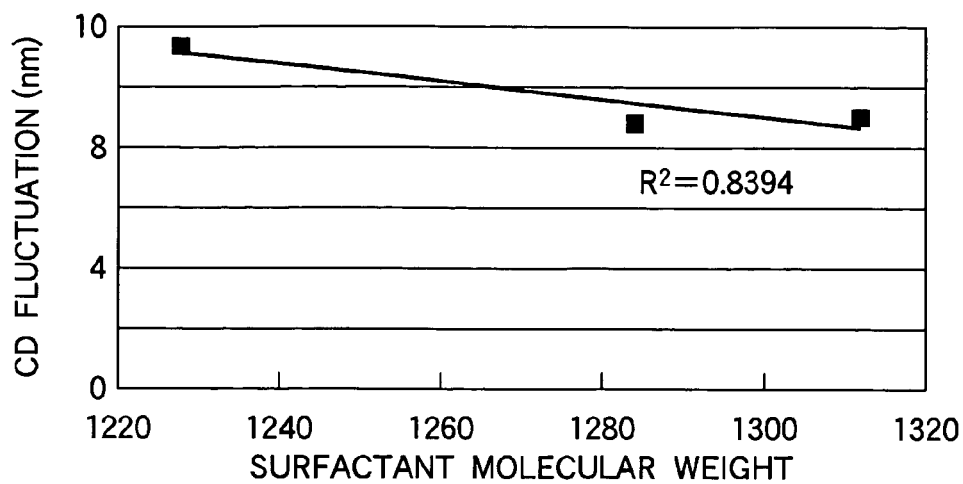
FIG. 7 is a graph showing the relationship between surfactant molecular weights and CD fluctuations where aqueous solutions respectively containing surfactants were used for performing a rinsing process after a developing process.
Figure 8:
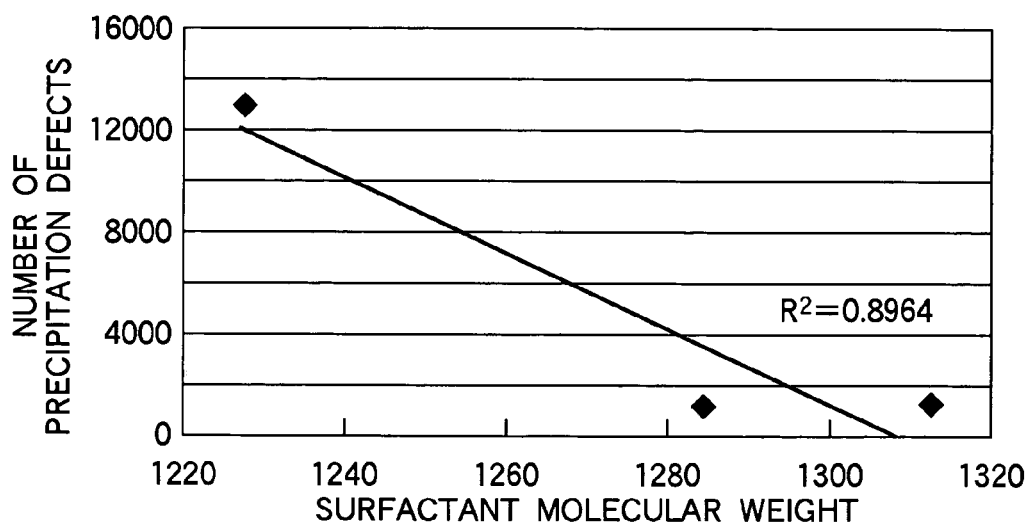
FIG. 8 is a graph showing the relationship between surfactant molecular weights and the number of precipitation defects where aqueous solutions respectively containing surfactants were used for performing a rinsing process after a developing process.

FIG. 7 is a graph showing the relationship between surfactant molecular weights and CD fluctuations where aqueous solutions respectively containing the surfactants A to C in a concentration of 100 ppm were used for performing a rinsing process after a developing process. Further, FIG. 8 is a graph showing the relationship between surfactant molecular weights and the number of precipitation defects where aqueous solutions respectively containing the surfactants A to C in a concentration of 100 ppm were used for performing a rinsing process after a developing process. As shown in FIGS. 7 and 8, it has been found that, with an increase in the surfactant molecular weight, the CD fluctuation is suppressed, and the number of precipitation defects becomes smaller.

Judging from the results described above, the surfactant molecular weight is preferably set to be larger within a range with which the surfactant can be dissolved in purified water. Of them, the surfactant molecular weight is preferably set at a value, such as 1,280 or more, that can suppress the number of precipitation defects to be lower than about 3,500 obtained by purified water used for the rinsing process and shown in FIG. 6. Further, since the hydrophilic group portions of the surfactants A to E have essentially the same molecular weight, it is thought with reference to Table 1 that the carbon number of the hydrophobic group is preferably larger than 11 and more preferably 14 or more. The polymerization degree of the hydrophilic group portions is distributed, and thus the difference in the molecular weight of the surfactants A to E does not completely agree with the difference in the molecular weight of the hydrophobic groups.

Figure 9:
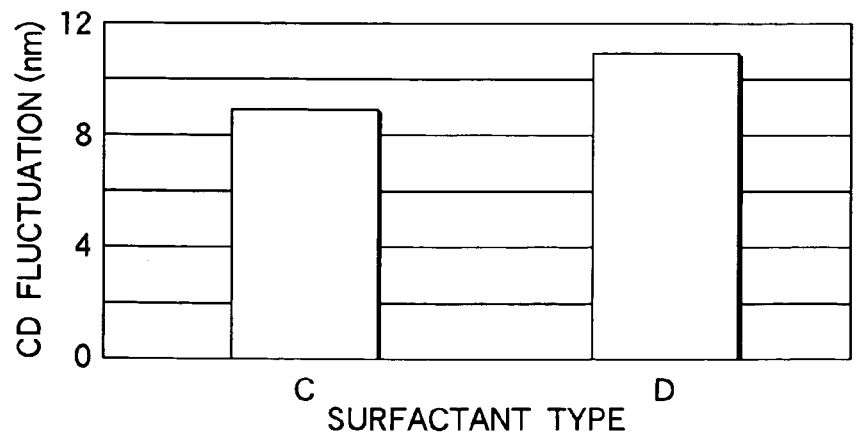
FIG. 9 is a graph showing CD fluctuations where aqueous solutions respectively containing surfactants C and D in a concentration of 100 ppm were used for performing a rinsing process after a developing process.
Figure 10:
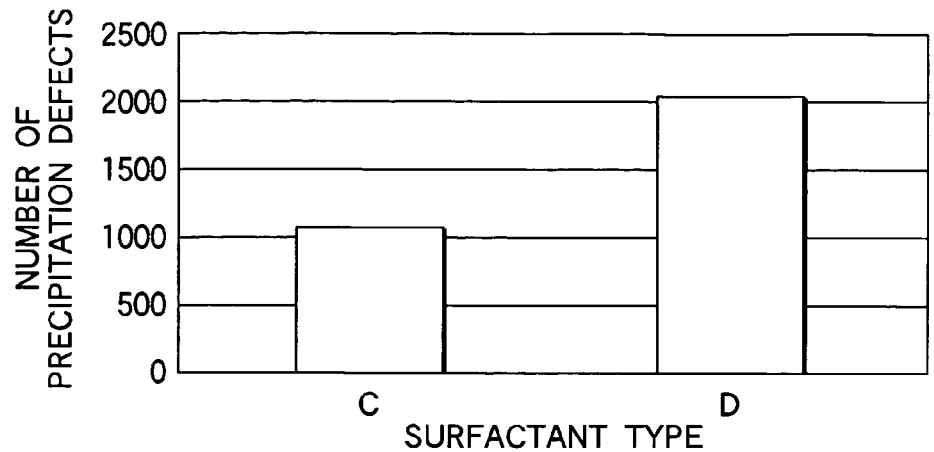
FIG. 10 is a graph showing the number of precipitation defects where aqueous solutions respectively containing surfactants C and D in a concentration of 100 ppm were used for performing a rinsing process after a developing process.

FIG. 9 is a graph showing CD fluctuations where aqueous solutions respectively containing the surfactants C and D in a concentration of 100 ppm were used for performing a rinsing process after a developing process. Further, FIG. 10 is a graph showing the number of precipitation defects where aqueous solutions respectively containing the surfactants C and D in a concentration of 100 ppm were used for performing a rinsing process after a developing process. As shown in FIGS. 9 and 10, the surfactant C suppresses the CD fluctuation and decreases the number of precipitation defects, as compared to the surfactant D.

The difference between the surfactant C and surfactant D resides in the presence/absence of double bonds in hydrophobic groups. Accordingly, it is thought that the result shown in FIGS. 9 and 10 was caused because double bonds in hydrophobic groups dissolved resist patterns. Judging from the results described above, it has been found that the rinsing liquid preferably contains a surfactant with hydrophobic groups including only single bonds and excluding double bonds. Further, the rinsing liquid preferably contains no surfactant with hydrophobic groups including triple bonds, because such a surfactant is thought to have a property similar to a surfactant including double bonds.

As described above with reference to the results shown in FIGS. 4 to 6 and 8 to 10, it is possible to suppress the CD fluctuation and generation of precipitation defects, where the rinsing liquid contains a surfactant while satisfying one of the following three conditions. Specifically, the surfactant concentration is set to be CMC or less; the surfactant molecular weight is large (preferably 1,280 or more) and the carbon number of hydrophobic groups is larger than 11 (preferably 14 or more); and the hydrophobic groups include no double bonds. The rinsing liquid most preferably satisfies these three conditions at the same time.

If surfactant micelles are generated in the surfactant solution stored in the surfactant solution tank 55, it may be difficult to completely decompose the micelles so as to dissolve the surfactant forming the micelles into purified water, when the surfactant solution is diluted by purified water. Accordingly, the surfactant solution stored in the surfactant solution tank 55 preferably has a concentration set to be CMC or less.

A surfactant dissolved in the rinsing liquid is not limited to polyethylene glycol sorbitan fatty acid ester, and another polyethylene glycol family surfactant may be used for this purpose. Specifically, an alternative is polyethylene glycol straight-chain alkyl ester shown in the following composition formula 2, polyethylene glycol fatty acid ester shown in the following composition formula 3, straight-chain alkyl addition type polyethylene glycol phenyl ester shown in the following composition formula 4, or branched-chain alkyl addition type polyethylene glycol phenyl ester shown in the following composition formula 5. Even in the alternative case, the same effect as in use of polyethylene glycol sorbitan fatty acid ester can be obtained by satisfying the conditions described above in relation to, e.g., the surfactant concentration and the carbon number of hydrophobic groups. Further, the same holds true for a case where an alternative is EO addition type acetylene glycol shown in the following composition formula 6, which is one of acetylene glycol family surfactants. In the composition formulas 2 to 6, R2 to R5 denote hydrophobic groups.

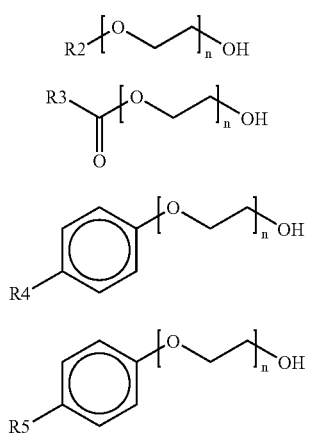

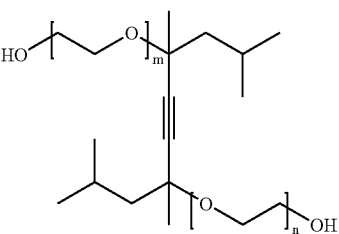

Next, an explanation will be given of a developing process performed by the developing apparatus (DEV). In this developing process, a rinsing process is performed by use of a rinsing liquid containing a surfactant as one of those described above in a predetermined concentration, as a matter of course.

Figure 11:
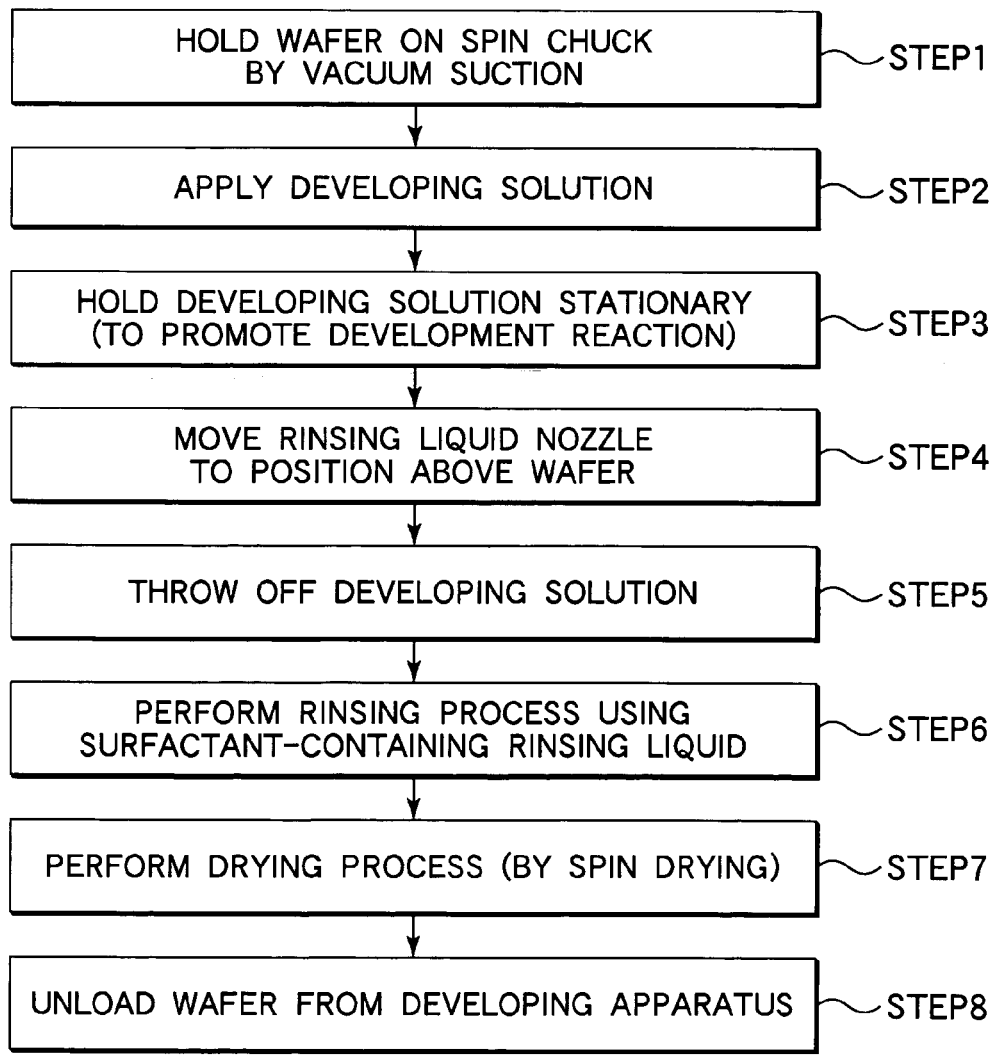
FIG. 11 is a flowchart showing a first developing process.

FIG. 11 is a flowchart showing a first developing process. At first, a wafer W is subjected to light exposure with a predetermined pattern, and is then subjected to a post-exposure baking process and a subsequent cooling process. Then, the wafer W is transferred by the transfer arm T of the wafer transfer unit to a position directly above the cup CP. Then, the wafer W is transferred by the lifter pins 5 onto the spin chuck 2 and is held by vacuum suction (STEP 1).

Then, the developing solution nozzle 11 is moved to a position above the center of the wafer W. Then, while the developing solution is delivered as a belt from the developing solution nozzle 11, the wafer W is rotated by 180° or more, such as 360°. Consequently, the developing solution is applied all over the surface of the wafer W to form a developing solution puddle (STEP 2). Alternatively, the developing solution nozzle 11 may be moved along the guide rail 21 for scanning while delivering the developing solution.

Then, the state of the wafer W with the developing solution applied thereon is held stationary for a predetermined time, such as 60 seconds, to promote the development (STEP 3). During this time, the developing solution nozzle 11 is retreated out of the cup CP, and the nozzle arm 18 of the rinsing liquid nozzle 13 is moved to place the rinsing liquid nozzle 13 at a position above the center of the wafer W (STEP 4).

When the developing time has elapsed, the wafer W is rotated to throw off the developing solution from the wafer W (STEP 5). Then, while the rinsing liquid containing a predetermined amount of surfactant as one of those described above is delivered as a belt from the rinsing liquid nozzle 13, the wafer W is rotated at a predetermined rotation number (such as 500 to 2,000 rpm) to perform a rinsing process (STEP 6). Before the rinsing liquid is supplied, the rinsing liquid nozzle 13 is preferably subjected to dummy dispensing at the waiting position to prevent surfactant residues or the like deposited in the rinsing liquid nozzle 13 from being supplied onto the wafer W. This makes it possible to reliably prevent particle generation due to the rinsing liquid.

The rinsing liquid nozzle 13 can supply the rinsing liquid onto the wafer W in a short time with low impact, and thereby enhance the effect of suppressing the CD fluctuation. This rinsing process may be performed such that the wafer W is held stationary or the wafer W is rotated at a predetermined rotation number (such as 1,000 rpm or less), while the rinsing liquid nozzle 13 is moved along the guide rail 30 for scanning.

After the rinsing liquid is supplied for a predetermined time, the rinsing liquid nozzle 13 is retreated out of the cup CP. Then, the rotation number of the wafer W is increased to expand the rinsing liquid on the wafer W and to throw off the rinsing liquid from the wafer W to dry the wafer W (STEP 7). This step is preferably performed such that the wafer W is first rotated at a rotation number of 300 to 1,000 rpm, such as 500 rpm, for 5 to 15 seconds, such as 10 seconds, and the wafer W is then rotated at a rotation number of 1,000 to 4000 rpm, such as 2,000 rpm, for 10 to 20 seconds, such as 15 seconds. Where operations are performed to throw off the rinsing liquid from the wafer W and to spin-dry the wafer W, as described above, it is possible to effectively prevent pattern fall from being caused.

After the wafer W is treated by the drying process, the wafer W is lifted by the lifter pins 5 above the spin chuck 2, and is then unloaded by the transfer arm T of the wafer transfer unit from the developing apparatus (DEV) (STEP 8). Then, the wafer W is subjected to a post baking process.

According to the first developing process described above, the rinsing liquid is prepared to contain a surfactant in a predetermined concentration and to satisfy predetermined conditions described above. Consequently, it is possible to suppress generation of precipitation defects, such as particles; to suppress the CD fluctuation and dissolution of resist patterns; and to prevent pattern fall from being caused, without performing a rinsing process using purified water. It follows that resist patterns can be formed with high cleanliness and precision.

Figure 12:
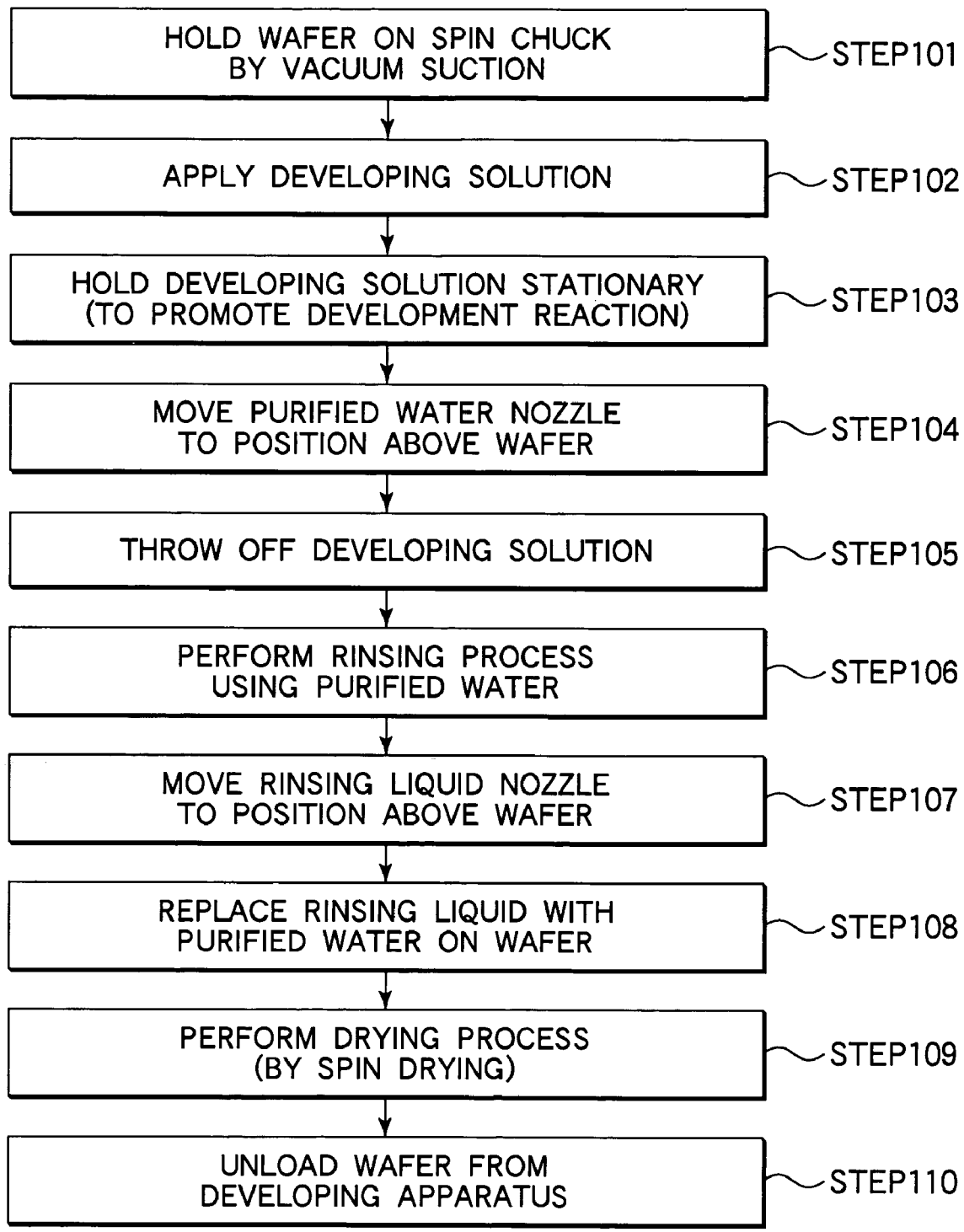
FIG. 12 is a flowchart showing a second developing process.

Next, an explanation will be given of a second developing process with reference to the flowchart shown in FIG. 12. A first, as in the first developing process, a wafer W treated by a light exposure process is held on the spin chuck 2 by vacuum suction (STEP 101). Then, the developing solution nozzle 11 is moved to a position above the center of the wafer W. Then, while the developing solution is delivered as a belt from the developing solution nozzle 11, the wafer W is rotated by 180° or more, such as 360°. Consequently, the developing solution is applied all over the surface of the wafer W to form a developing solution puddle (STEP 102).

Then, the state of the wafer W with the developing solution applied thereon is held stationary for a suitable time, such as 60 seconds, to promote the development (STEP 103). During this time, the nozzle arm 14 of the developing solution nozzle 11 is retreated out of the cup CP, and the purified water nozzle 12 is moved to place the purified water nozzle 12 at a position above the center of the wafer W (STEP 104).

When a predetermined time for promoting the development reaction has elapsed, the wafer W is rotated by the spin chuck 2 to throw off the developing solution (STEP 105). Then, a rinsing process using purified water is performed (STEP 106). In this rinsing process, the following operation is preferably performed. Specifically, when the rotation number of the wafer W reaches 500 to 2,000 rpm, such as 1,000 rpm, purified water is supplied for 2 seconds or more, such as 5 seconds, while the rotation number is maintained. Then, while purified water is supplied, the rotation number of the wafer W is decreased to 100 to 1,000 rpm, such as 500 rpm, and this rotation number is maintained for 2 seconds or more, such as 10 seconds. The rotation number of the wafer W in STEP 106 is set at an optimum value selected in accordance with the size of a wafer W to be processed.

Incidentally, there may be a case where a hardly soluble layer, which is thus difficult to remove by ordinary rinsing, is formed on the resist film on the wafer W, if purified water is supplied directly after the developing solution is thrown off. In this respect, where rinsing using purified water and the developing solution is performed prior to rinsing using only purified water, it is possible to prevent a hardly soluble layer from being generated on the resist film.

After the purified water rinsing is performed, the purified water nozzle 12 is retreated out of the cup CP, and the nozzle arm 18 of the rinsing liquid nozzle 13 is moved to place the rinsing liquid nozzle 13 at a position essentially above the center of the wafer W (STEP 107). Then, while the wafer W is rotated preferably at 500 rpm or less, such as 100 rpm, the rinsing liquid containing a surfactant as one of those described above is supplied onto the wafer W to replace most of the purified water and residual developing solution on the resist film with the rinsing liquid (STEP 108). In other words, the surface of the resist film is replaced with the rinsing liquid. Where the wafer W is rotated at 500 rpm or less while the surfactant-containing rinsing liquid is supplied, as described above, the amount of rinsing liquid thrown off by the rotation can be decreased without deteriorating the replacement ability of the rinsing liquid. Consequently, the consumption amount of the rinsing liquid can be set as low as possible.

After the rinsing liquid is supplied onto the wafer W, the rotation number of the wafer W is increased to expand the rinsing liquid and to throw off the rinsing liquid to dry the wafer W (STEP 109). This step is preferably performed such that the wafer W is first rotated at a rotation number of 300 to 1,000 rpm, such as 500 rpm, for 5 to 15 seconds, such as 10 seconds, and the wafer W is then rotated at a rotation number of 1,000 to 4000 rpm, such as 2,000 rpm, for 10 to 20 seconds, such as 15 seconds. Where operations are performed to throw off the rinsing liquid from the wafer W and to spin-dry the wafer W, as described above, it is possible to effectively prevent pattern fall from being caused.

After the wafer W is treated by the drying process, the wafer W is lifted by the lifter pins 5 above the spin chuck 2, and is then unloaded by the transfer arm T of the wafer transfer unit from the developing apparatus (DEV) (STEP 110). Then, the wafer W is subjected to a post baking process.

Also in the second developing process described above, the rinsing liquid is prepared to contain a surfactant in a predetermined concentration and to satisfy predetermined conditions described above. Consequently, it is possible to suppress generation of precipitation defects, such as particles, and to suppress the CD fluctuation and dissolution of resist patterns, without performing a rinsing process using purified water. Further, after the rinsing liquid containing a surfactant in a predetermined concentration is supplied onto the wafer W, an operation is performed to throw off the rinsing liquid to dry the wafer W. This makes it possible to prevent pattern fall from being caused.

FIGS. 13A to 13F are views schematically showing the process flows of the first to sixth developing processes. In FIGS. 13A to 13F, a reference symbol 111 represents a developing process, a reference symbol 112 represents a rinsing process using a surfactant-containing rinsing liquid, a reference symbol 113 represents a drying process, and a reference symbol 114 represents a rinsing process using purified water. The first process shown in FIG. 13A and the second process shown in FIG. 13B have already been explained above, and thus their explanation will be omitted. Accordingly, an explanation will be given of the processes shown in FIGS. 13C to 13F.

The third developing process comprises a developing process using a developing solution, a rinsing process using a surfactant-containing rinsing liquid, a rinsing process using purified water, and a drying process, performed in this order. The fourth developing process comprises a developing process using a developing solution, a rinsing process using purified water, a rinsing process using a surfactant-containing rinsing liquid, a rinsing process using purified water, and a drying process, performed in this order. The fifth developing process comprises a developing process using a developing solution, a rinsing process using a surfactant-containing rinsing liquid, a developing process using a developing solution, a rinsing process using purified water, and a drying process, performed in this order. The sixth developing process comprises a rinsing process using a surfactant-containing rinsing liquid, a drying process, a developing process using a developing solution, a rinsing process using purified water, and a drying process, performed in this order. These processes also make it possible to suppress generation of precipitation defects and to suppress the CD fluctuation and dissolution of resist patterns.

Figure 13A:
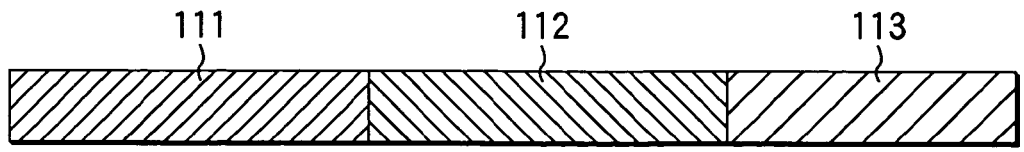
FIGS. 13A to 13F are views schematically showing the first to sixth developing processes.
Figure 13B:
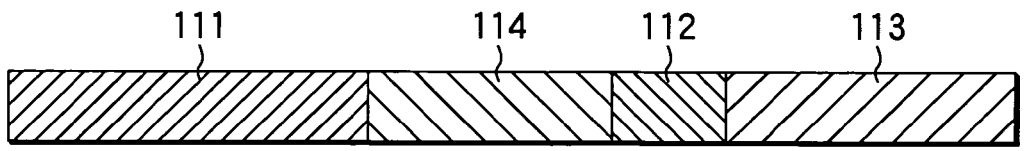
Figure 13C:
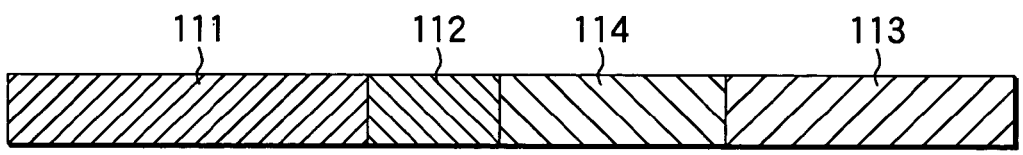
Figure 13D:
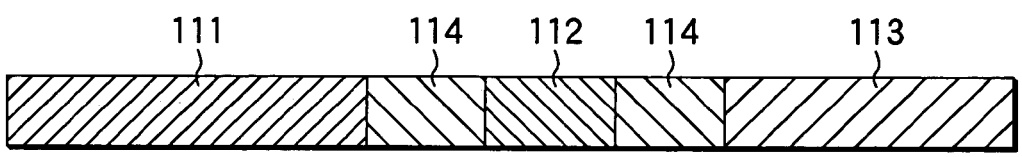
Figure 13E:
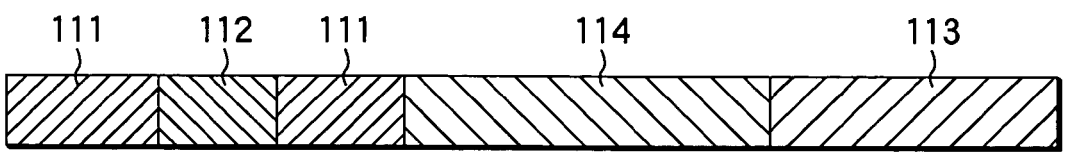
Figure 13F:
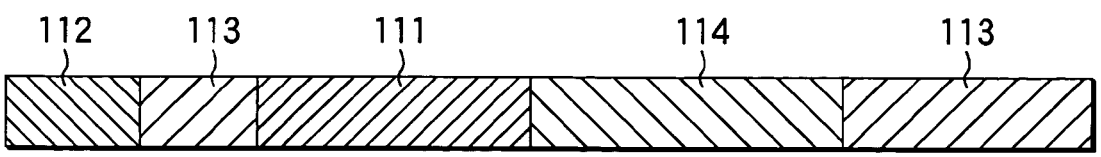

Each of the third developing process shown in FIG. 13C, the fifth developing process shown in FIG. 13E, and the sixth developing process shown in FIG. 13F is a process including a final stage arranged to supply purified water onto the surface of the wafer W, and then throw off this purified water from the wafer W to dry the wafer W. Accordingly, these processes are suitable for a case where no problem arises due to pattern fall caused by the surface tension of purified water.

The present invention is not limited to the embodiments described above, and it may be modified in various manners. For example, in the embodiments described above, the water-based cleaning liquid is exemplified by purified water, but the liquid may be prepared by adding a small amount of another substance into purified water. Further, the rinsing liquid nozzle 13 is exemplified by a structure configured to deliver the rinsing liquid as a belt. Alternatively, the rinsing liquid nozzle 13 may be a nozzle of the straight type, as in the purified water nozzle 12. In this case, the rinsing liquid nozzle 13 preferably has a structure that can set the impact onto a wafer W as low as possible while maintaining the necessary flow rate of the rinsing liquid.

Further, in the embodiments described above, the present invention is applied to a developing process performed on a semiconductor wafer, but this is not limiting. For example, the present invention may be applied to a developing process performed on another substrate, such as a substrate for liquid crystal display devices (LCD), as long as a miniaturized resist pattern can be formed on the substrate. Furthermore, the present invention includes various modifications made by suitably combining some of the components of the embodiments described above or removing a part of the components, as long as they do not depart from the scope of the present invention.

The embodiments described above are intended only to explain the technical content of the present invention, and, therefore, the invention should not be construed as being limited to the specific details of the embodiments. Various modifications may be made without departing from the spirit of the present invention or scope defined by the appended claims.

The present invention is suitably applied to a process and apparatus for manufacturing semiconductor devices or flat panel displays.

What is claimed is:

1. A rinsing method for performing a rinsing process, the method comprising:
   supplying a rinsing liquid onto a substrate with a light-exposed pattern formed thereon and treated by a developing process,
   wherein the rinsing liquid contains a polyethylene glycol family surfactant in a critical micelle concentration or less, and
   wherein the surfactant includes a hydrophobic group having a carbon number of larger than 11 and including only single bonds and excluding double and triple bonds.

2. The rinsing method according to claim 1, wherein the polyethylene glycol family surfactant is selected from the group consisting of polyethylene glycol sorbitan fatty acid ester, polyethylene glycol straight-chain alkyl ester, polyethylene glycol fatty acid ester, straight-chain alkyl addition type polyethylene glycol phenyl ester, and branched-chain alkyl addition type polyethylene glycol phenyl ester.

3. The rinsing method according to claim 1, wherein supplying the rinsing liquid onto the substrate uses a nozzle configured to deliver the rinsing liquid essentially as a belt, and comprises moving the nozzle for scanning above the substrate, or setting the nozzle above the substrate to be directed in a radial direction of the substrate and rotating the substrate at a predetermined rotation number, while delivering the rinsing liquid essentially as a belt from the nozzle.

4. A rinsing method for performing a rinsing process, the method comprising:
   supplying a rinsing liquid onto a substrate with a light-exposed pattern formed thereon and treated by a developing process,
   wherein the rinsing liquid contains a polyethylene glycol family surfactant, and the surfactant includes a hydrophobic group having a carbon number of larger than 11 and including only single bonds and excluding double bond and triple bonds.

5. The rinsing method according to claim 4, wherein the polyethylene glycol family surfactant is selected from the group consisting of polyethylene glycol sorbitan fatty acid ester, polyethylene glycol straight-chain alkyl ester, polyethylene glycol fatty acid ester, straight-chain alkyl addition type polyethylene glycol phenyl ester, and branched-chain alkyl addition type polyethylene glycol phenyl ester.

6. The rinsing method according to claim 4, wherein supplying the rinsing liquid onto the substrate uses a nozzle configured to deliver the rinsing liquid essentially as a belt, and comprises moving the nozzle for scanning above the substrate, or setting the nozzle above the substrate to be directed in a radial direction of the substrate and rotating the substrate at a predetermined rotation number, while delivering the rinsing liquid essentially as a belt from the nozzle.

7. The rinsing method according to claim 1, wherein the surfactant has a molecular weight of 1,280 or more.

8. The rinsing method according to claim 1, wherein the surfactant is polyethylene glycol sorbitan fatty acid ester.

9. The rinsing method according to claim 4, wherein the surfactant has a molecular weight of 1,280 or more.

10. The rinsing method according to claim 4, wherein the surfactant is polyethylene glycol sorbitan fatty acid ester.

11. The rinsing method according to claim 1, wherein the hydrophobic group is selected from the group consisting of $C_{11}H_{23}$, $C_{15}H_{31}$, and $C_{17}H_{35}$.

12. The rinsing method according to claim 1, wherein the hydrophobic group has a carbon number of larger than 14.

13. The rinsing method according to claim 7, wherein the hydrophobic group is selected from the group consisting of $C_{15}H_{31}$ and $C_{17}H_{35}$.

14. The rinsing method according to claim 13, wherein the surfactant is polyethylene glycol sorbitan fatty acid ester.

15. The rinsing method according to claim 7, wherein the hydrophobic group is $C_{17}H_{35}$.

16. The rinsing method according to claim 15, wherein the surfactant is polyethylene glycol sorbitan fatty acid ester.

17. The rinsing method according to claim 9, wherein the hydrophobic group is selected from the group consisting of $C_{15}H_{31}$ and $C_{17}H_{35}$.

18. The rinsing method according to claim 17, wherein the surfactant is polyethylene glycol sorbitan fatty acid ester.

19. The rinsing method according to claim 9, wherein the hydrophobic group is $C_{17}H_{35}$.

20. The rinsing method according to claim 19, wherein the surfactant is polyethylene glycol sorbitan fatty acid ester.

* * * * *

UNITED STATES PATENT AND TRADEMARK OFFICE
CERTIFICATE OF CORRECTION

| | |
|---|---|
| PATENT NO. | : 7,419,773 B2 |
| APPLICATION NO. | : 11/652497 |
| DATED | : September 2, 2008 |
| INVENTOR(S) | : Ryouichirou Naitou et al. |

It is certified that error appears in the above-identified patent and that said Letters Patent is hereby corrected as shown below:

<u>Title Page</u>, please insert the following

Item --[30], Foreign Application Priority Data

July 14, 2004     (JP)   ............2004-207574--

Signed and Sealed this

Fifth Day of May, 2009

JOHN DOLL
*Acting Director of the United States Patent and Trademark Office*